(12) United States Patent
Yao et al.

(10) Patent No.: US 10,461,113 B2
(45) Date of Patent: Oct. 29, 2019

(54) IMAGE SENSORS, AND FABRICATION AND OPERATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Guo Feng Yao, Shanghai (CN); Jue Lu, Shanghai (CN); Hai Fang Zhang, Shanghai (CN); Xuan Jie Liu, Shanghai (CN)

(73) Assignees: Samiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/927,594

(22) Filed: Mar. 21, 2018

(65) Prior Publication Data

US 2018/0277586 A1    Sep. 27, 2018

(30) Foreign Application Priority Data

Mar. 22, 2017  (CN) .......................... 2017 1 0173899

(51) Int. Cl.
*H01L 31/062*  (2012.01)
*H01L 27/146*  (2006.01)

(52) U.S. Cl.
CPC .. *H01L 27/14643* (2013.01); *H01L 27/14621* (2013.01); *H01L 27/14636* (2013.01); *H01L 27/14689* (2013.01)

(58) Field of Classification Search
CPC ......... H01L 27/14607; H01L 27/14605; H01L 27/14603; H01L 27/14645; H01L 27/146; H01L 27/14643; H01L 27/14621; H01L 31/02161; H01L 31/02162; H01L 31/02008; H01L 31/02013; G09G 2300/0452
See application file for complete search history.

(56) References Cited

U.S. PATENT DOCUMENTS 10,163,966 B2 * 12/2018 Cheng ............... H01L 27/14645
2016/0300871 A1 * 10/2016 Borthakur .......... H01L 27/1464

* cited by examiner

*Primary Examiner* — Hsien Ming Lee
(74) *Attorney, Agent, or Firm* — Anova Law Group, PLLC (57) ABSTRACT

An image sensor includes a substrate having a first surface and a second surface. The substrate includes a photo-sensitive region and a connection region. The image sensor also includes a buffer layer formed on the first surface of the substrate in the photo-sensitive region, and a metal grid formed on the buffer layer and including a plurality of staggered metal wires. The metal grid is connected to an operation voltage, and a plurality of trenches are formed in the metal grid with each trench surrounded by the metal wires. The image sensor further includes a plurality of color filters formed in the plurality of trenches of the metal grid. The metal grid induces charges in the substrate to prevent recombination between the charges generated by photo-sensitive components and the defects in the substrate. As such, the dark current is reduced, and the performance of the image sensor is improved.

20 Claims, 6 Drawing Sheets

FIG. 14

IMAGE SENSORS, AND FABRICATION AND OPERATION METHODS THEREOF

CROSS-REFERENCES TO RELATED APPLICATIONS

This application claims the priority of Chinese Patent Application No. CN201710173899.0, filed on Mar. 22, 2017, the entire content of which is incorporated herein by reference.

FIELD OF THE DISCLOSURE

The present disclosure generally relates to the field of semiconductor fabrication technology and, more particularly, relates to image sensors, and fabrication and operation methods of the image sensors.

BACKGROUND

With the continuous improvement of semiconductor technology, image sensor, as a basic information acquisition device in modern society, has been more and more widely used.

Based on the difference in the components used, image sensors can be divided into two categories: charge-coupled device (CCD) image sensors and complementary metal-oxide-semiconductor (CMOS) image sensors. With the development of semiconductor technology, the performance of CMOS transistors is gradually improved, and the resolution of CMOS image sensors becomes to catch up and even surpass the resolution of CCD image sensors. Moreover, CMOS image sensors also demonstrate a number of advanced features, such as high integration degree, small energy consumption, fast speed, low cost, etc.

CMOS image sensor is a typical solid-state image sensor, and is usually formed by an image element array, a row driver, a column driver, a timing control logic, an analog-to-digital (AD) converter, a data bus output interface, a control interface, etc.

Based on the structural difference, CMOS image sensors can be divided into front-side illuminated CMOS image sensors, back-side illuminated CMOS image sensors, and stacked CMOS image sensors. In a front-side illuminated CMOS image sensor, the photodiodes are located behind the circuit transistors, and thus the intensity of incident light may be affected due to the light blocking effect. The relative position of the photodiodes with respect to the circuit transistors in a back-side illuminated CMOS image sensor may be opposite to the relative position of the photodiodes with respect to the circuit transistors in the front-side illuminated CMOS image sensor. That is, the photodiodes in a back-side illuminated CMOS image sensor are located in front of the circuit transistors. Stacked CMOS image sensor is developed from the back-side illuminated CMOS image sensor. Specifically, in a stacked CMOS image sensor, the circuits that are originally arranged right next to the photo-sensitive components are now partially arranged under the photo-sensitive components such that the device may have more internal space. Therefore, in addition to realizing functional diversification, the stacked CMOS image sensor may also achieve the goal for miniaturization.

To increase the intensity of the light, the back-side illuminated CMOS image sensor and the stacked CMOS image sensor allow the light to directly enter the photodiodes without being blocked by other components of the image sensor. Therefore, the quality of the shooting results under a low-light condition may be significantly improved. As such, the back-side illuminated CMOS image sensor and the stacked CMOS image sensor have been widely used in picture-shooting structures in cameras, electronic toys, television conferences, security systems, and other devices.

However, the dark current in conventional CMOS image sensors may be large and the performance of conventional CMOS image sensors may still need to be improved. The disclosed image sensor as well as fabrication and operation methods thereof are directed to solve one or more problems set forth above and other problems in the art.

BRIEF SUMMARY OF THE DISCLOSURE

One aspect of the present disclosure provides an image sensor. The image sensor includes a substrate having a first surface and a second surface opposite to the first surface. The substrate includes a photo-sensitive region and a connection region. The image sensor also includes a buffer layer formed on the first surface of the substrate in the photo-sensitive region, and a metal grid formed on the buffer layer and including a plurality of staggered metal wires. The metal grid is connected to an operation voltage, and a plurality of trenches are formed in the metal grid with each trench surrounded by the metal wires. The image sensor further includes a plurality of color filters formed in the plurality of trenches of the metal grid.

Another aspect of the present disclosure provides a method for fabricating an image sensor. The method includes providing a substrate having a first surface and a second surface opposite to the first surface. The substrate includes a photo-sensitive region and a connection region. The method also includes forming a buffer layer on the first surface of the substrate in the photo-sensitive region and forming a metal grid on the buffer layer and including a plurality of staggered metal wires. The metal grid is connected to an operation voltage, and a plurality of trenches are formed in the metal grid with each trench surrounded by the metal wires. The method further includes forming a plurality of color filters in the plurality of trenches of the metal grid.

Another aspect of the present disclosure provides an operation method for an image sensor. The operation method includes providing the image sensor. The image sensor includes a substrate having a first surface and a second surface opposite to the first surface. The substrate includes a photo-sensitive region and a connection region. The image sensor also includes a buffer layer formed on the first surface of the substrate in the photo-sensitive region, and a metal grid formed on the buffer layer and including a plurality of staggered metal wires. A plurality of trenches are formed in the metal grid with each trench surrounded by the metal wires. The image sensor further includes a plurality of color filters formed in the plurality of trenches of the metal grid. The operation method further includes connecting the metal grid to an operation voltage.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

A CMOS image sensor may use a photo-sensitive component for image capture. The CMOS image sensor includes a substrate and a photo-sensitive component formed in the substrate. The core of the photo-sensitive component is a plurality of photodiodes. Irradiation of external light on the plurality of photodiodes may excite electrons and holes in the photodiodes. The electrons and the holes in the depleted region of the photodiodes may be separated by a built-in electric field such that charges may accumulate in the photodiodes. Moreover, a carrier collector may be formed in the substrate of the CMOS image sensor. The carrier collector may collect the electrons and the holes generated by the photodiodes and send out a voltage signal. The number of the captured charges, either electrons or holes, may be reflected by the voltage signal.

However, because defects and surface dangling bonds in the substrate of the CMOS image sensor may easily capture electrons and holes generated by the photodiodes and further lead to a dark current, the performance of the CMOS image sensor may be affected. The present disclosure provides image sensors and methods for fabricating and operating image sensors.

Figure 13:
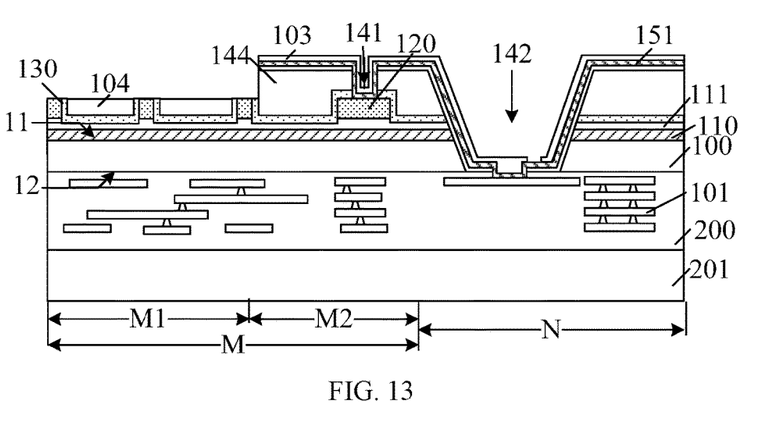
Figure 14:
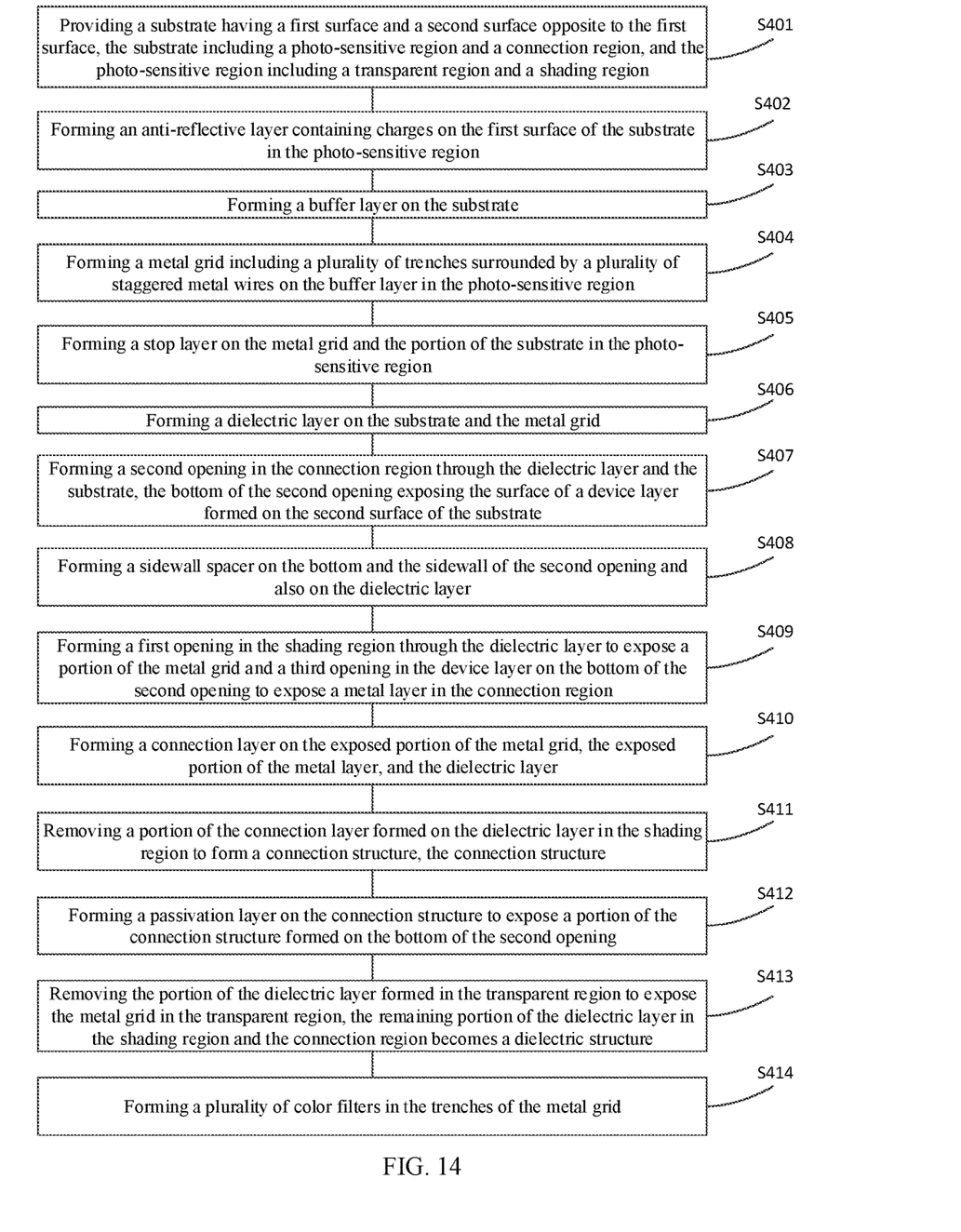
FIG. 14 illustrates a flowchart of an exemplary method for fabricating an image sensor consistent with various embodiments of the present disclosure.

FIG. 14 illustrates a flowchart of an exemplary method for fabricating an image sensor consistent with various embodiments of the present disclosure. FIGS. 1-13 illustrate schematic views of structures at certain stages of the exemplary fabrication process.

Figure 1:
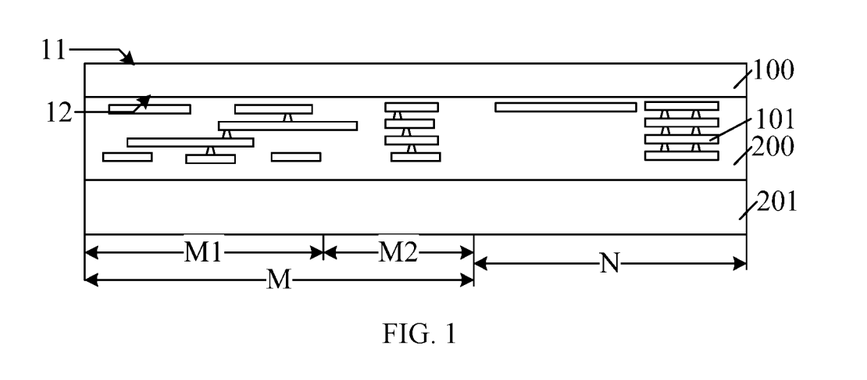
FIGS. 1-13 illustrate schematic views of structures at certain stages of an exemplary fabrication process for an image sensor consistent with various embodiments of the present disclosure.

Referring to FIG. 14, at the beginning of the fabrication process, a substrate having two opposite surfaces, i.e. a first surface and a second surface, and including a photo-sensitive region and a connection region may be provided (S401). FIG. 1 shows a schematic cross-section view of a semiconductor structure consistent with various embodiments of the present disclosure.

Referring to FIG. 1, a substrate 100 may be provided. The substrate 100 may have a first surface 11 and a second surface 12 opposite to the first surface 11. The substrate 100 may include a photo-sensitive region M and a connection region N. A photo-sensitive component may be formed in the photo-sensitive region M of the substrate 100. That is, the photo-sensitive region M of the substrate 100 may be used to form the photo-sensitive component. Moreover, the connection region N of the substrate 100 may be used to form a soldering pad in a subsequent process.

In one embodiment, the substrate 100 is made of silicon. In other embodiments, the substrate may be made of germanium, SiGe, silicon on insulator (SOI), germanium on insulator (GOI), or any other appropriate semiconductor material or structure.

In one embodiment, the photo-sensitive component includes a plurality of photodiodes.

Further, a carrier collector may be formed in the photo-sensitive region M of the substrate 100. The carrier collector may be used to collect the electrons generated by the photo-sensitive component. In other embodiments, the carrier collector formed in the photo-sensitive region of the substrate may be used to collect the holes generated by the photo-sensitive component.

Under the irradiation of light, the photo-sensitive component may produce excited electrons and holes. The number of electrons and holes generated by the photo-sensitive component may be related to the intensity of the light. The carrier collector may be used to collect the electrons generated by the photo-sensitive component and create a voltage signal. The amplitude of the voltage signal may be related to the number of the captured electrons, and thus may be related to the intensity of the light. As such, the optical signal may be converted into an electric signal.

In one embodiment, a device layer 200 may be formed on the second surface 12 of the substrate 100. Further, the device layer 200 may include a metal layer 101 and a connection plug connecting the metal layer 101. The device layer 200 and the substrate 100 may together form a sensor wafer.

The metal layer 101 and the connection plug may be used to realize electrical connection from the photo-sensitive component to external electrical circuits.

In one embodiment, the metal layer 101 may be made of Cu. In other embodiments, the metal layer may also be made of Al or any other appropriate material.

In one embodiment, the connection plug may be made of W. In other embodiments, the connection plug may be made of Cu or any other appropriate material.

In one embodiment, a carrier wafer 201 may be in contact with the surface of the device layer 200. That is, the device layer 200 may be sandwiched between the carrier wafer 201 and the substrate 100.

In one embodiment, the fabrication method may include bonding the carrier wafer 201 to the surface of the device layer 200 of the sensor wafer. In addition, prior to bonding the carrier wafer 201 to the surface of the device layer 200 of the sensor wafer, the fabrication method may also include mechanically thinning down the substrate 100 and then planarizing the substrate 100. In one embodiment, the substrate 100 may be planarized through an etching process, a chemical mechanical polishing (CMP) process, or a process combining both etching and CMP. After mechanically thinning down and planarizing the substrate 100, the thickness of the substrate 100 may be in a range of approximately 2 μm to 3 μm.

Figure 2:
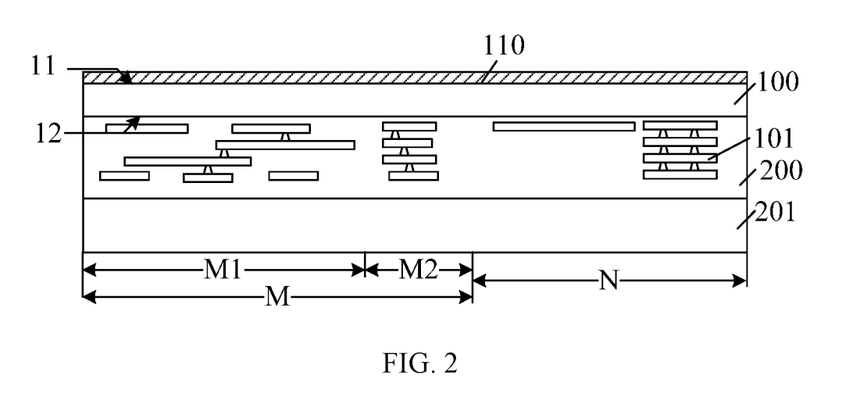

Further, returning to FIG. 14, an anti-reflective layer containing charges may be formed on the first surface of the substrate in the photo-sensitive region (S402). FIG. 2 shows a schematic cross-section view of a semiconductor structure consistent with various embodiments of the present disclosure.

Referring to FIG. 2, an anti-reflective layer 110 may be formed on the first surface 11 of the substrate 100 in the photo-sensitive region M. The anti-reflective layer 110 may contain a plurality of charges.

The anti-reflective layer 110 may be used to reduce the light reflected from the first surface 11 of the substrate 100 such that the intensity of the light irradiated onto the photo-sensitive component may be improved. Moreover, the anti-reflective layer 110 may also be used to reduce the dark current of the image sensor, and thus improve the performance of the formed image sensor.

In one embodiment, the carrier collector may be used to capture electrons generated by the photo-sensitive component. The charges in the anti-reflective layer 110 may be electrons. That is, the anti-reflective layer 110 may carry negative charges.

Because the anti-reflective layer 110 carries negative charges, the anti-reflective layer 110 may be able to keep the electrons appearing near the first surface 11 of the substrate 100 away from the first surface 11 of the substrate 100. Therefore, the electrons may enter the substrate 100 and recombine with the holes in the substrate 100 so that the number of the holes in the substrate 100 may be reduced. Because the number of the holes in the substrate 100 is reduced, recombination between the electrons generated in the photo-sensitive component and the holes in the substrate 100 may be suppressed, and the dark current in the formed image sensor may thus be reduced. Therefore, the influence of the dark current on the number of the electrons collected by the carrier collector may be reduced, and thus the optical signal may be accurately converted into a voltage signal.

In other embodiments, the substrate may include a carrier collector used to collect holes. Accordingly, the charges in the anti-reflective layer may be holes. That is, the anti-reflective layer may carry positive charges.

In one embodiment, the anti-reflective layer 110 may be made of one or more of silicon oxide, silicon nitride, aluminum oxide, hafnium oxide, tantalum oxide, etc. The anti-reflective layer 110 may be formed by a process including ALD, PVD, CVD, or decoupling plasma growth.

Figure 3:
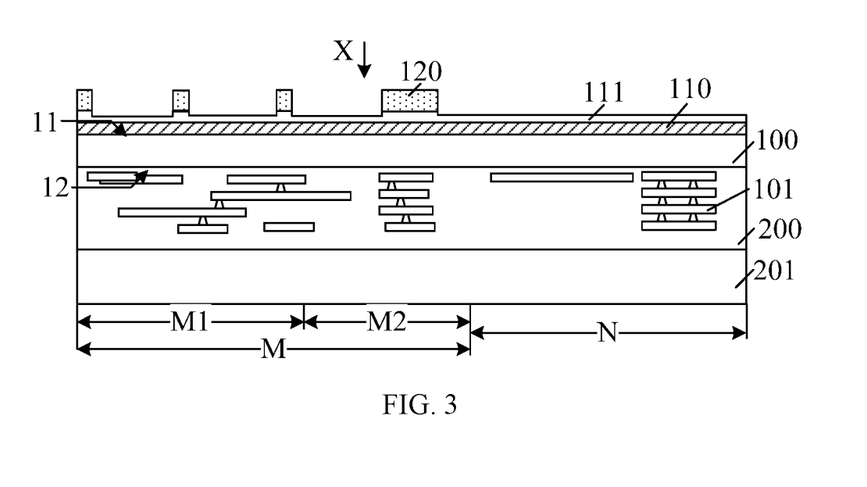
Figure 4:
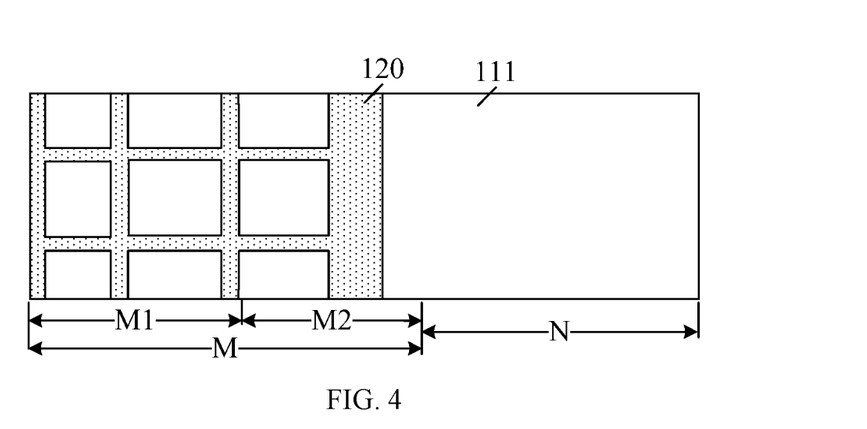

Further, returning to FIG. 14, a buffer layer may be formed on the substrate (S403). FIGS. 3-4 show schematic views of a semiconductor structure consistent with various embodiments of the present disclosure. FIG. 4 shows a cross-section view of the structure shown in FIG. 3 in an X direction.

Referring to FIGS. 3-4, a buffer layer 111 may be formed on the first surface of the substrate 100. The buffer layer 111 may be used to electrically isolate a subsequently formed metal grid from the substrate 100 such that the influence of the metal grid on the photo-sensitive component in the substrate 100 may be reduced.

In one embodiment, the buffer layer 111 may be formed on the anti-reflective layer 110, and may be made of silicon oxide. The buffer layer 111 may be formed by a process including CVD.

Further, returning to FIG. 14, a metal grid, including a plurality of trenches surrounded by a plurality of staggered metal wires, may be formed on the buffer layer in the photo-sensitive region (S404).

Referring to FIGS. 3-4, after forming the buffer layer 111 on the first surface of the substrate 100, a metal grid 120 may be formed on the buffer layer 111 in the photo-sensitive region M. The metal grid 120 may include a plurality of staggered metal wires. A plurality of trenches may be formed by the metal wires. Specifically, the plurality of trenches are surrounded by the metal wires. That is, each trench may correspond to a recessed region surrounded by the metal wires of the metal grid 120. The metal grid 120 may be used to connect an operation voltage.

The metal grid 120 may be able to prevent crosstalk between the light beams of different pixels. Therefore, as the optical crosstalk in the formed image sensor is reduced, the performance of the image sensor may be improved.

In one embodiment, the metal grid 120 may be used to connect an operation voltage, and a buffer layer 111 may be formed between the metal grid 120 and the substrate 100. The metal grid 120, the buffer layer 111, and the substrate 100 may together form a capacitor. When the metal grid 120 is connected to the operation voltage, charges may be induced at the first surface 11 of the substrate 100 so that the substrate 100 may contain induced charges. The induced charges in the substrate 100 may recombine with the defects in the substrate 100, and thus reduce the number of the defects in the substrate 100. As such, recombination between the charges generated by the photo-sensitive component and the defects in the substrate 100 may be reduced. Therefore, the dark current may be reduced, and the performance of the formed image sensor may be improved.

In one embodiment, the portion of the substrate 100 in the photo-sensitive region M may also include a transparent region M1 and a shading region M2. The shading region M2 may be arranged between the transparent region M1 and the connection region N.

In one embodiment, the carrier collector may be used to collect electrons, and then convert the acquired electrons into a voltage output signal. The metal grid 120 may be used to connect a negative voltage or the ground (i.e. zero volt).

When the metal grid 120 is used to connect a negative voltage, the metal grid 120 may be able to keep the electrons appearing near the first surface 11 of the substrate 100 away from the first surface 11 of the substrate 100. Therefore, the electrons may enter the substrate 100 and recombine with the holes in the substrate 100 so that the number of the holes in the substrate 100 may be reduced. Because the number of the holes in the substrate 100 is reduced, recombination between the electrons generated by the photo-sensitive component and the holes in the substrate 100 may be suppressed, and the dark current in the formed image sensor may thus be reduced. Therefore, the disclosed fabrication methods may reduce the influence of the dark current on the number of the electrons collected by the carrier collector, and thus the optical signal may be accurately converted into a voltage signal.

When the metal grid 120 is connected to the ground (i.e. zero volt), the voltage of the metal grid 120 may thus remain stable, the influence of the external environment temperature on the voltage of the metal grid 120 may be reduced. Therefore, the influence of the external environment on the electrons in the substrate 100 may be reduced, and thus the dark current may also be reduced.

In other embodiments, the substrate may include a carrier collector used to capture the holes generated by the photo-sensitive component. Accordingly, the metal grid may be used to connect a positive voltage or the ground (i.e. zero volt).

When the metal grid is connected to a positive voltage, the metal grid may be able to attract the electrons in the substrate to be close to the first surface of the substrate, and thus reduce the number of the electrons in the substrate. As such, recombination between the holes generated by the photo-sensitive component and the electrons in the substrate may be suppressed, and the dark current in the formed image sensor may thus be reduced. Therefore, the influence of the dark current on the number of the holes collected by the carrier collector may be reduced, and thus the optical signal may be accurately converted into a voltage signal.

In one embodiment, the metal grid 120 may be formed by a process including forming a metal cover layer on the anti-reflective layer 110, and then patterning the metal cover layer to form the metal grid 120.

In one embodiment, the metal grid 120 may be made of Cu or Al.

Figure 5:
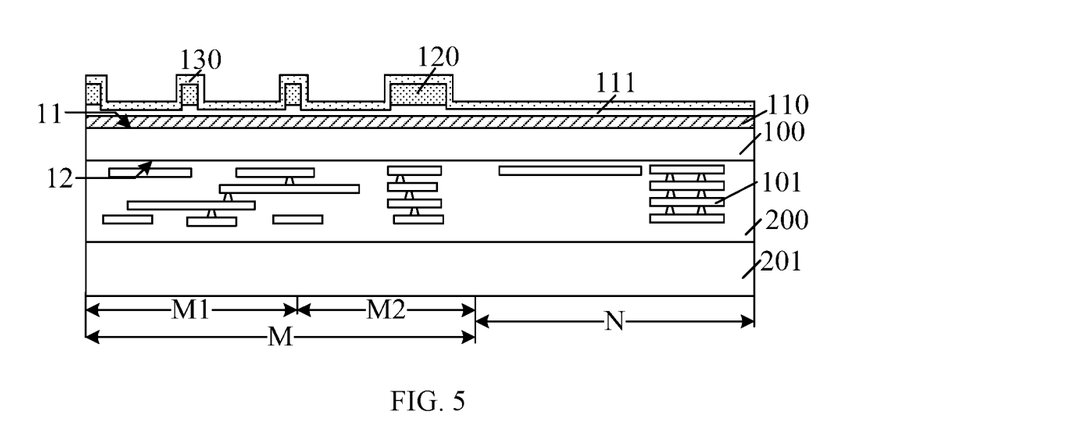

Further, returning to FIG. 14, a stop layer may be formed on the metal grid and the portion of the substrate in the photo-sensitive region (S405). FIG. 5 shows a schematic cross-section view of a semiconductor structure consistent with various embodiments of the present disclosure.

Referring to FIG. 5, a stop layer 130 may be formed on the metal grid 120 and the portion of the substrate 100 in the photo-sensitive region M. The stop layer 130 and a subsequently-formed dielectric layer may be made of different materials.

The stop layer 130 may be used for process control during a subsequently-performed process to remove the dielectric layer formed in the transparent region M1.

In one embodiment, the stop layer 130 may be made of aluminum oxide, hafnium oxide, silicon nitride, tantalum oxide, titanium nitride, or any other appropriate material. The process to form the stop layer 130 may include PVD, ALD, metal-organic CVD, etc.

In one embodiment, the stop layer may also cover the portion of the substrate 100 in the connection region N.

Figure 6:
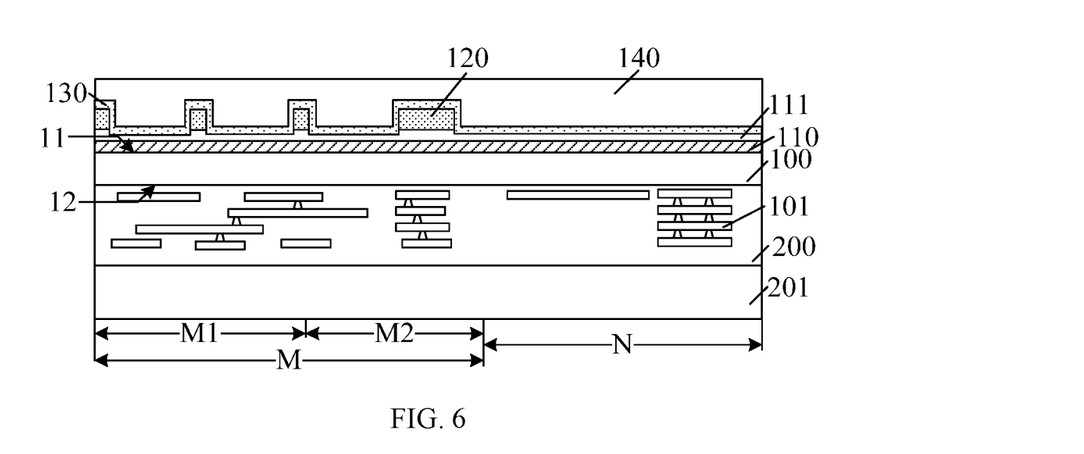

Returning to FIG. 14, a dielectric layer may be formed on the substrate and the metal grid (S406). FIG. 6 shows a schematic cross-section view of a semiconductor structure consistent with various embodiments of the present disclosure.

Referring to FIG. 6, a dielectric layer 140 may be formed on the substrate 100 and the metal grid 120. In one embodiment, the dielectric layer 140 may be made of silicon oxide. In other embodiments, the dielectric layer may be made of silicon oxynitride. In one embodiment, the dielectric layer 140 may also be formed on the stop layer 130.

The dielectric layer 140 may be formed by a process including atmospheric pressure chemical vapor deposition (APCVD) or sub-atmospheric CVD. By using an APCVD or a sub-atmospheric CVD to form the dielectric layer 140, damages to the stop layer 130 may be limited. In other embodiments, the process to form the dielectric layer may include fluid CVD or low-pressure chemical vapor deposition (LPCVD).

Figure 7:
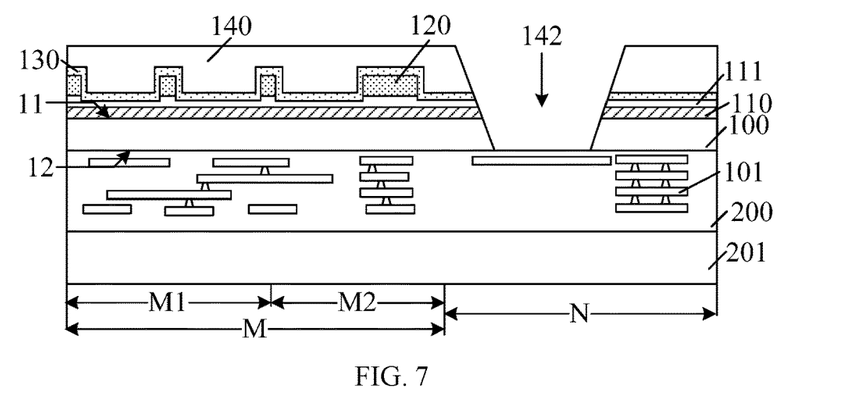

Returning to FIG. 14, a second opening may be formed in the connection region through the portion of the dielectric layer and the substrate (S407). FIG. 7 shows a schematic cross-section view of a semiconductor structure consistent with various embodiments of the present disclosure.

Referring to FIG. 7, a second opening 142 may be formed in the portion of the dielectric layer 140 and the substrate 100 in the connection region N. The second opening 142 may be formed in the connection region N through the dielectric layer 140 and the substrate 100. The bottom of the second opening may expose the device layer 200.

In one embodiment, the sidewall surface of the second opening 142 may have a second acute angle with respect to the normal direction of the first surface 11 of the substrate 100. Specifically, when an acute angle is formed by the sidewall of the second opening 142 and the normal direction of the first surface 11 of the substrate, during a subsequent process to form a connection structure, the connection structure may be easily formed on the sidewall surface of the second opening 142. Therefore, the adhesion between the sidewall of the second opening 142 and the connection structure may be improved, and the thickness of the connection structure may be easily controlled. As such, the disclosed fabrication method may be able to improve the performance of the formed image transistor.

In one embodiment, the second opening 142 may be formed by a process including the following steps. First, a patterned photoresist layer may be formed on a dielectric layer 140. The sidewall surface of the photoresist layer and the normal direction of the first surface 11 may form a first acute angle. Further, by etching the dielectric layer 140 using the photoresist layer as an etch mask, the second opening 142 may be formed in the dielectric layer 140 in the connection region N. The sidewall surface of the second opening 142 and the normal direction of the first surface 11 of the substrate 100 may form a second acute angle. In one embodiment, the second acute angle between the sidewall surface of the second opening 142 and the normal direction of the first surface 11 of the substrate 100 may be smaller than 50 degrees.

In one embodiment, the photoresist layer may be formed by a process including forming a patterned initial photoresist layer on the dielectric layer 140, and then performing a thermal treatment process on the initial photoresist layer to allow back flow of the initial photoresist layer.

Further, when the temperature used in the thermal treatment process is too high, or the process time of the thermal treatment process is too long, the first acute angle may be formed too large such that the second acute angle may also be undesirably large. Therefore, the integration level of the formed image sensor may be likely reduced. However, when the temperature used in the thermal treatment process is too low, or the process time of the thermal treatment process is too short, the first acute angle may be formed too small such that the second acute angle may also be undesirably small. Therefore, the adhesion between a subsequently-formed connection structure and the sidewall of the second opening 142 may not be improved. In one embodiment, the process temperature used in the thermal treatment process may be in a range of approximately 150° C. to 240° C., and the process time may be in a range of approximately 60 seconds to 300 seconds.

The bottom width of the second opening 142 may not be too small. When the bottom width of the second opening 142 is too small, the width of a subsequently-formed third opening may also be undesirably small. Further, because a connection structure may then be formed in the third opening, when the width of the third opening is too small, the connection structure may not be easily formed in the third opening. Therefore, in one embodiment, the bottom width of the second opening 142 may be larger than 50 μm.

Figure 8:
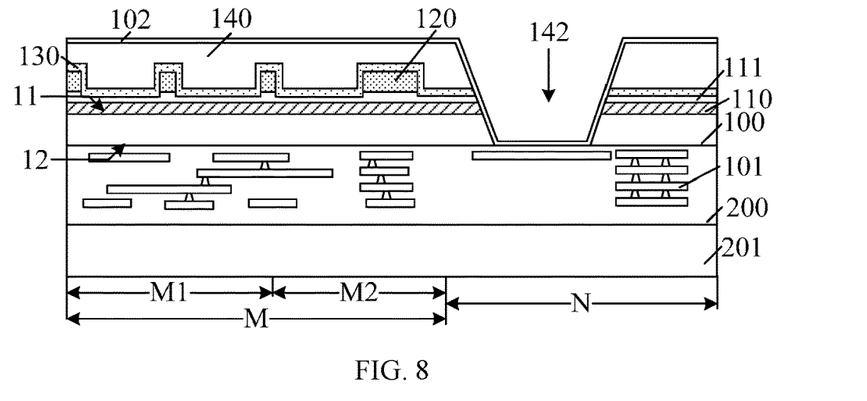

Further, returning to FIG. 14, a sidewall spacer may be formed on the bottom and the sidewall of the second opening and also on the dielectric layer (S408). FIG. 8 shows a schematic cross-section view of a semiconductor structure consistent with various embodiments of the present disclosure.

Referring to FIG. 8, a sidewall spacer 102 may be formed on the bottom and the sidewall of the second opening 142 and also on the dielectric layer 140. The sidewall spacer 102 may be used to isolate a subsequently-formed connection structure from the portion of the substrate 100 in the sidewall of the second opening 142.

In one embodiment, the sidewall spacer 102 may be made of silicon nitride, silicon oxide, silicon oxynitride, or any other appropriate material. The process to form the sidewall spacer 102 may include CVD.

Figure 9:
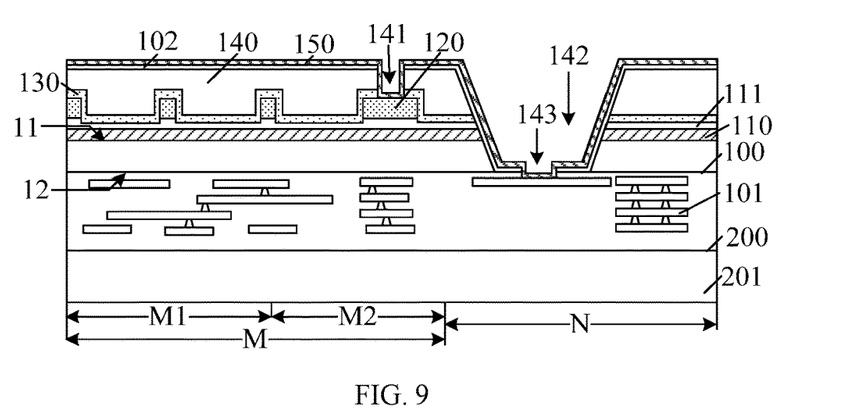

Returning to FIG. 14, a first opening may be formed in the shading region through the dielectric layer to expose a portion of the metal grid, and a third opening may be formed in the device layer on the bottom of the second opening to expose a metal layer in the connection region (S409). FIG. 9 shows a schematic cross-section view of a semiconductor structure consistent with various embodiments of the present disclosure.

Referring to FIG. 9, a first opening 141 may be formed in the portion of the dielectric layer 140 in the shading region M2. The bottom of the first opening 141 may expose a portion of the metal grid 120 formed in the shading region M2. Moreover, a third opening 143 may be formed in the device layer 200 on the bottom of the second opening 142. The third opening 143 may expose a portion of a metal layer 101 in the connection region N.

In one embodiment, the first opening 141 and the third opening 143 may be formed by a process including the following steps. First, a patterned layer may be formed on the dielectric layer 140 and also on the sidewall and the bottom of the second opening 142. The patterned layer may expose a portion of the dielectric layer 140 above the metal grid 120 in the shading region M2 and a portion of the device layer 200 above the metal layer 101 on the bottom of the second opening 142. An etching process may then be performed on the exposed portion of the dielectric layer 140 and the device layer 200 using the patterned layer as an etch mask. As such, the first opening 141 and the third opening 143 may be formed.

In other embodiments, the metal grid may not need to be connected to the metal layer. Accordingly, the second opening and the third opening may not need to be formed. That is, only the first opening may be formed to expose a portion of the metal grid.

Further, returning to FIG. 14, a connection layer may be formed on the exposed portion of the metal grid, the exposed portion of the metal layer, and the dielectric layer (S410).

Referring to FIG. 9, the connection layer 150 may be formed on the exposed portion of the metal grid 120 in the shading region M2, the exposed portion of the metal layer 101 in the connection region N, and the dielectric layer 140.

In one embodiment, the connection layer 150 may be made of Cu or Al. The connection layer 150 may be formed by a process including CVD, PVD, or any other appropriate deposition process.

Figure 10:
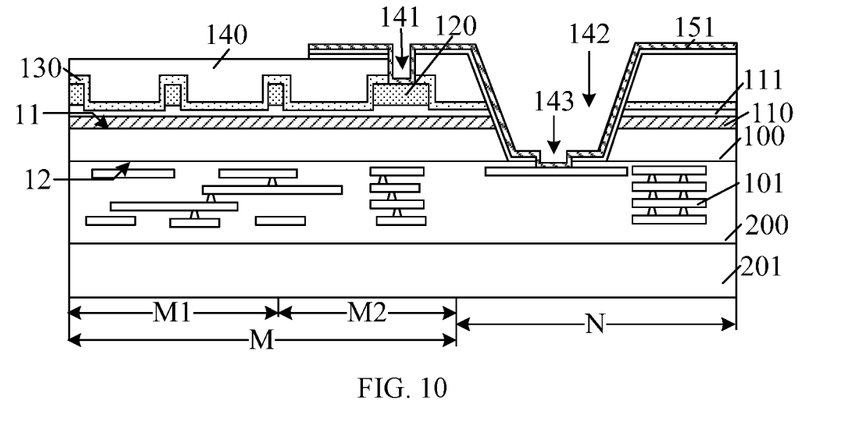

Further, returning to FIG. 14, the portion of the connection layer formed on the dielectric layer in the shading region may be removed to form a connection structure (S411). FIG. 10 shows a schematic cross-section view of a semiconductor structure consistent with various embodiments of the present disclosure.

Referring to FIG. 10, the portion of the connection layer 150 (referring to FIG. 9) formed on the dielectric layer 140 in the shading region M2 may be removed to form a connection structure 151.

In one embodiment, the portion of the connection layer 150 formed on the dielectric layer 140 in the shading region M2 may be removed by a process including wet etching or dry etching.

Figure 11:
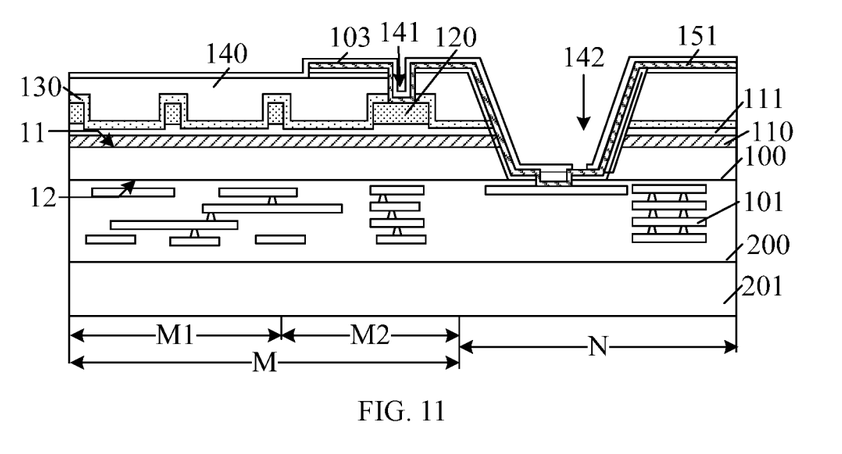

Returning to FIG. 14, a passivation layer may be formed on the connection structure to expose a portion of the connection structure on the bottom of the second opening (S412). FIG. 11 shows a schematic cross-section view of a semiconductor structure consistent with various embodiments of the present disclosure.

Referring to FIG. 11, a passivation layer 103 may be formed on the connection structure 151. The passivation layer 103 may expose a portion of the connection structure 151 on the bottom of the second opening 142.

The portion of the connection structure 151 exposed by the passivation layer 103 may serve as a soldering pad. The portion of the connection structure 151 covered by the passivation layer 103 may serve as a connection wire.

In one embodiment, the passivation layer 103 may have a single-layer structure formed by one of silicon oxide, silicon nitride, and silicon oxynitride, or a multiple-layer structure formed by more than one of silicon oxide, silicon nitride, and silicon oxynitride. The passivation layer 103 may be formed by a process including CVD.

In one embodiment, the metal grid 120 needs to be electrically connected to the metal layer 101. Therefore, the metal grid 120 and the metal layer 101 may have a common soldering pad. In other embodiments, the metal layer may not be electrically connected to the metal grid. Accordingly, the second opening and the third opening may not be formed in the dielectric layer. For example, the dielectric layer may expose a portion of the top surface of the metal grid, the soldering pad may be formed on the dielectric layer in the connection region, and the connection wire may be formed on the surface of the metal grid and the surface of the dielectric layer.

Figure 12:
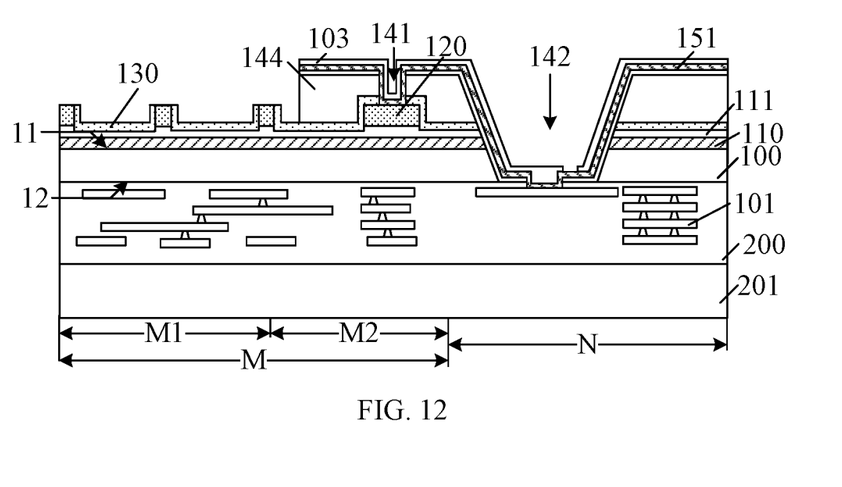

Further, returning to FIG. 14, a dielectric structure may be formed by removing the portion of the dielectric layer formed in the transparent region to expose the portion of the metal grid in the transparent region (S413). FIG. 12 shows a schematic cross-section view of a semiconductor structure consistent with various embodiments of the present disclosure.

Referring to FIG. 12, by performing an etching process on the dielectric layer 140, the portion of the dielectric layer 140 (referring to FIG. 11) formed in the transparent region M1 may be removed to expose the metal grid 120. As such, the remaining portion of the dielectric layer 140 in the shading region and the connection region N may become a dielectric structure 144.

In one embodiment, during the process to remove the portion of the dielectric layer 140 formed in the transparent region M1, because the stop layer 130 and the dielectric layer 140 are formed by different materials, the stop layer 130 may be able to provide a control for the removal of the portion of the dielectric layer 140 formed in the transparent region M1. Therefore, the fabrication process may be simplified. Moreover, the stop layer 130 may also provide protection for the metal grid 120 to ensure no damage to the metal grid 120 during the process to remove the portion of the dielectric layer 140 formed in the transparent region M1.

In one embodiment, the portion of the dielectric layer 140 in the transparent region M1 may be removed by a process including dry etching or wet etching.

Returning to FIG. 14, after forming the dielectric structure, a color filter may be formed in each trench in the metal grid (S414). FIG. 13 shows a schematic cross-section view of a semiconductor structure consistent with various embodiments of the present disclosure.

Referring to FIG. 13, corresponding to the plurality of trenches in the metal grid 120, a plurality of color filters 104 may be formed in the trenches. The plurality of color filters 104 may be used for filtering light of different wavelengths.

According to the disclosed fabrication methods for image sensors, a metal grid may be used to connect an operation voltage. A buffer layer may be formed between the metal grid and the substrate. The metal grid, the buffer layer, and the substrate may together form a capacitor. When the metal grid is connected to the operation voltage, the metal grid may induce charges on the first surface of the substrate so that the substrate may accordingly contain induced charges. Further, the induced charges in the substrate may recombine with the defects in the substrate, and thus reduce the number of the defects in the substrate. As such, recombination between the charges generated by the photo-sensitive component and the defects in the substrate may be reduced. Therefore, the dark current may also be reduced, and thus the performance of the formed image sensor may be improved.

Further, the sidewall surface of the second opening and the normal direction of the first surface of the substrate may form an acute angle. During the process to form the connection structure, the connection structure may be easily formed on the sidewall surface of the second opening so that the adhesion between the sidewall of the second opening and the connection structure may be improved, and the thickness of the connection structure may be easily controlled. As such, the disclosed fabrication method may be able to improve the performance of the formed image transistor.

Further, prior to forming the dielectric layer, a stop layer may be formed on the metal grid and also on the portion of the substrate in the photo-sensitive region. The stop layer and the dielectric layer may be made different materials. Therefore, during the process to remove the portion of the dielectric layer formed in the transparent region, the stop layer may be able to provide a control for the removal of the portion of the dielectric layer formed in the transparent region. In the meantime, the stop layer may also provide protection for the metal grid to ensure no damage to the metal grid during the process to remove the portion of the dielectric layer formed in the transparent region.

Further, the present disclosure also provides an image sensor. FIG. 13 shows a schematic cross-section view of an image sensor consistent with various embodiments of the present disclosure.

Referring to FIG. 13, the image sensor may include a substrate 100. The substrate 100 may have a first surface 11 and, opposite to the first surface 11, a second surface 12. The substrate 100 may include a photo-sensitive region M and a connection region N. A photo-sensitive component may be formed in the photo-sensitive region M of the substrate 100.

The image sensor may also include a buffer layer 111 formed on the first surface 11 of the substrate 100 in the photo-sensitive region M and a metal grid 120 formed on the buffer layer 111. The metal grid 120 may further include a plurality of staggered metal wires. A plurality of trenches may be formed by the metal wires. Specifically, the plurality of trenches are surrounded by the metal wires. That is, each trench may correspond to a recessed region surrounded by the metal wires of the metal grid 120. The metal grid 120 may be used to connect an operation voltage. The image sensor may further include a plurality of color filters 104 formed in the plurality of trenches in the metal grid 120.

In one embodiment, the metal grid 120 may be used to connect an operation voltage. The buffer layer 111 may be formed between the metal grid 120 and the substrate 100. The metal grid 120, the buffer layer 111, and the substrate 100 may together form a capacitor. When the metal grid 120 is connected to the operation voltage, the metal grid may induce charges on the first surface 11 of the substrate 100 so that the substrate 100 may accordingly contain induced charges. Further, the induced charges in the substrate 100 may recombine with the defects in the substrate 100, and thus reduce the number of the defects in the substrate 100. As such, recombination between the charges generated by the photo-sensitive component and the defects in the substrate 100 may be reduced. Therefore, the dark current may also be reduced, and thus the performance of the formed image sensor may be improved.

In one embodiment, the portion of the substrate 100 in the photo-sensitive region M may also include a transparent region M1 and a shading region M2.

The image sensor may also include a device layer 200 formed on the second surface 12 of the substrate 100, and a carrier wafer 201 placed on the device layer 200. The device layer 200 may be sandwiched by the carrier layer 201 and the substrate 100.

The image sensor may also include a soldering pad formed on the substrate 100 in the connection region M, and a connection wire used to connect the soldering pad to the metal grid 120. The connection wire and the soldering pad may together form a connection structure 151.

The image sensor may further include a metal layer 101 formed in the device layer 200, and a connection plug formed in the device layer 200 and connected to the metal layer 101.

In one embodiment, the image sensor may also include a dielectric structure 144 formed on the portion of the substrate 100 in the shading region M2 and the connection region N. A first opening 141 may be formed in the portion of the dielectric structure 122 in the shading region M2. A portion of the metal grid 120 may be exposed on the bottom of the first opening 141. A second opening 142 may be formed in the portion of the dielectric structure 144 and the substrate 100 in the connection region N. The second opening 142 may expose a portion of the device layer 200. A third opening 143 may be formed in the device layer 200 on the bottom of the second opening 142. The third opening may expose a portion of a metal layer 101 formed in the device layer 200.

In one embodiment, the metal grid 120 may be electrically connected to the metal layer 101 through the connection structure 151. The soldering pad may be formed on the device layer 200 on the bottom of the second opening 142. In other embodiments, the metal grid may not be electrically connected to the metal layer. For example, the soldering pad may be formed on the dielectric structure in the connection region, and the connection wire may be formed on the surface of the metal grid and the surface of the dielectric structure.

In one embodiment, the connection wire may be formed on the dielectric structure 144 as well as the bottom and the sidewall surfaces of the first opening 141, the second opening 142, and the third opening 143. The connection wire may be electrically connected to the soldering pad.

In one embodiment, the dielectric structure 144 may be made of silicon oxide or silicon oxynitride.

The sidewall of the second opening 142 and the normal direction of the first surface 11 of the substrate 100 may form an acute angle smaller than 50 degrees. The bottom width of the second opening 142 may be larger than 50 µm.

In one embodiment, the image sensor may also include a passivation layer 103 formed on the connection wire. The passivation layer 103 may expose the soldering pad.

The image sensor may also include an anti-reflective layer 110 formed between the first surface 11 of the substrate 100 and the buffer layer 111. The anti-reflective layer 110 may contain a plurality of charges.

In one embodiment, a carrier collector may be formed in the substrate 100. The anti-reflective layer 110 may carry negative charges or may be charge neutral. In other embodiments, the anti-reflective layer may carry positive charges.

According to the disclosed image sensors, a metal grid may be used to connect an operation voltage, and a buffer layer may be formed between the metal grid and the substrate. When the metal grid is connected to the operation voltage, the metal grid may be able to induce charges on the first surface of the substrate so that the substrate may accordingly contain induced charges. Further, the induced charges in the substrate may recombine with the defects in the substrate, and thus reduce the number of the defects in the substrate. As such, recombination between the charges generated by the photo-sensitive component and the defects in the substrate may be reduced. Therefore, the dark current may also be reduced, and thus the performance of the formed image sensor may be improved.

Further, a carrier collector may be formed in the substrate. When the carrier collector is used to capture electrons generated by the photo-sensitive component, the operation voltage may be a negative voltage. Because the operation voltage connected to the metal grid is negative, the metal grid may be able to keep the electrons appearing near the first surface of the substrate away from the first surface. Therefore, the electrons may enter the substrate and recombine with the holes in the substrate so that the number of the holes in the substrate may be reduced. Because the number of the holes in the substrate 100 is reduced, recombination of electrons generated by the photo-sensitive component and the holes in the substrate may be suppressed, and the dark current in the formed image sensor may thus be reduced. Therefore, the influence of the dark current on the number of the electrons collected by the carrier collector may be reduced, and thus the optical signal may be accurately converted into a voltage signal.

When the carrier collector is used to capture holes generated by the photo-sensitive component, the operation voltage may be a positive voltage. Because the operation voltage connected to the metal grid is positive, the metal grid may be able to attract the electrons in the substrate to be close to the first surface of the substrate, and thus reduce the number of the electrons in the substrate. As such, recombination between the holes generated by the photo-sensitive component and the electrons in the substrate 100 may be suppressed, and the dark current in the formed image sensor may thus be reduced. Therefore, the influence of the dark current on the number of the holes collected by the carrier collector may be reduced, and thus the optical signal may be accurately converted into a voltage signal.

Moreover, the present disclosure also provides an operation method for image sensors. The operation method may include providing an image sensor (referring to FIG. 13) consistent with the disclosed image sensor described above. The fabrication methods for the image sensor may refer to FIGS. 1-14 and the above illustration.

The operation method may further include connecting the metal grid 120 (referring to FIG. 13) to an operation voltage.

In one embodiment, the metal grid 120 may be connected to the operation voltage. Moreover, referring to FIG. 13, a buffer layer 111 may be formed between the metal grid 120 and the substrate 100. The metal grid 120, the buffer layer 111, and the substrate 100 may together form a capacitor. When the metal grid 120 is connected to the operation voltage, charges may be induced at the first surface 11 of the substrate 100 so that the substrate 100 may contain induced charges. The induced charges in the substrate 100 may be recombined with the defects in the substrate 100, and thus reduce the number of the defects in the substrate 100. As such, recombination between the charges generated by the photo-sensitive component and the defects in the substrate 100 may be reduced. Therefore, the dark current may be reduced, and the performance of the formed image sensor may be improved.

In one embodiment, a carrier collector may be formed in the substrate 100. When the carrier collector is used to capture electrons generated by the photo-sensitive component, the operation voltage is negative. In other embodiment, when the carrier collector is used to capture holes generated by the photo-sensitive component, the operation voltage is positive.

According to the disclosed operation methods, a metal grid may be used to connect an operation voltage, and a buffer layer may be formed between the metal grid and the substrate. When the metal grid is connected to the operation voltage, the metal grid may be able to induce charges on the first surface of the substrate so that the substrate may accordingly contain induced charges. Further, the induced charges in the substrate may recombine with the defects in the substrate, and thus reduce the number of the defects in the substrate. As such, recombination between the charges generated by the photo-sensitive component and the defects in the substrate may be reduced. Therefore, the dark current may also be reduced, and thus the performance of the formed image sensor may be improved.

Compared to existing image sensors and the corresponding fabrication methods and operation methods, the disclosed image sensors, and fabrication and operation methods may demonstrate several advantages.

According to the disclosed image sensors, a metal grid may be used to connect an operation voltage, and a buffer layer may be formed between the metal grid and the substrate. When the metal grid is connected to the operation voltage, the metal grid may be able to induce charges on the first surface of the substrate so that the substrate may accordingly contain induced charges. Further, the induced charges in the substrate may recombine with the defects in the substrate, and thus reduce the number of the defects in the substrate. As such, recombination between the charges generated by the photo-sensitive component and the defects in the substrate may be reduced. Therefore, the dark current may also be reduced, and thus the performance of the formed image sensor may be improved.

Further, a carrier collector may be formed in the substrate. When the carrier collector is used to capture electrons generated by the photo-sensitive component, the operation voltage may be a negative voltage. Because the operation voltage connected to the metal grid is negative, the metal grid may be able to keep the electrons appearing near the first surface of the substrate away from the first surface. Therefore, the electrons may enter the substrate and recombine with the holes in the substrate so that the number of the holes in the substrate may be reduced. Because the number of the holes in the substrate 100 is reduced, recombination of electrons generated by the photo-sensitive component and the holes in the substrate may be suppressed, and the dark current in the formed image sensor may thus be reduced. Therefore, the influence of the dark current on the number of the electrons collected by the carrier collector may be reduced, and thus the optical signal may be accurately converted into a voltage signal.

When the carrier collector is used to capture holes generated by the photo-sensitive component, the operation voltage may be a positive voltage. Because the operation voltage connected to the metal grid is positive, the metal grid may be able to attract the electrons in the substrate to be close to the first surface of the substrate, and thus reduce the number of the electrons in the substrate. As such, recombination between the holes generated by the photo-sensitive component and the electrons in the substrate 100 may be suppressed, and the dark current in the formed image sensor may thus be reduced. Therefore, the influence of the dark current on the number of the holes collected by the carrier collector may be reduced, and thus the optical signal may be accurately converted into a voltage signal.

According to the disclosed fabrication methods for image sensors, a metal grid may be used to connect an operation voltage. A buffer layer may be formed between the metal grid and the substrate. The metal grid, the buffer layer, and the substrate may together form a capacitor. When the metal grid is connected to the operation voltage, the metal grid may induce charges on the first surface of the substrate so that the substrate may accordingly contain induced charges. Further, the induced charges in the substrate may recombine with the defects in the substrate, and thus reduce the number of the defects in the substrate. As such, recombination between the charges generated by the photo-sensitive component and the defects in the substrate may be reduced. Therefore, the dark current may also be reduced, and thus the performance of the formed image sensor may be improved.

Further, the sidewall surface of the second opening and the normal direction of the first surface of the substrate may form an acute angle. During the process to form the connection structure, the connection structure may be easily formed on the sidewall surface of the second opening so that the adhesion between the sidewall of the second opening and the connection structure may be improved, and the thickness of the connection structure may be easily controlled. As such, the disclosed fabrication method may be able to improve the performance of the formed image transistor.

Further, prior to forming the dielectric layer, a stop layer may be formed on the metal grid and also on the portion of the substrate in the photo-sensitive region. The stop layer and the dielectric layer may be made different materials. Therefore, during the process to remove the portion of the dielectric layer formed in the transparent region, the stop layer may be able to provide a control for the removal of the portion of the dielectric layer formed in the transparent region. In the meantime, the stop layer may also provide protection for the metal grid to ensure no damage to the metal grid during the process to remove the portion of the dielectric layer formed in the transparent region.

According to the disclosed operation methods, a metal grid may be used to connect an operation voltage, and a buffer layer may be formed between the metal grid and the substrate. When the metal grid is connected to the operation voltage, the metal grid may be able to induce charges on the first surface of the substrate so that the substrate may accordingly contain induced charges. Further, the induced charges in the substrate may recombine with the defects in the substrate, and thus reduce the number of the defects in the substrate. As such, recombination between the charges generated by the photo-sensitive component and the defects in the substrate may be reduced. Therefore, the dark current may also be reduced, and thus the performance of the formed image sensor may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An image sensor, comprising:
   a substrate having a first surface and a second surface opposite to the first surface, wherein the substrate includes a photo-sensitive region and a connection region, the photo-sensitive region comprises a transparent region and a shading region, and the shading region is between the transparent region and the connection region;
   a buffer layer formed on the first surface of the substrate in the photo-sensitive region;
   a metal grid formed on the buffer layer and including a plurality of staggered metal wires in the transparent region and in the shading region, wherein the metal grid is connected to an operation voltage, and a plurality of trenches are formed in the metal grid with each trench surrounded by the plurality of staggered metal wires; and
   a plurality of color filters formed in the plurality of trenches of the metal grid.

2. The image sensor according to claim 1, further including:
   a connection structure formed on the substrate,
   wherein the connection structure includes a soldering pad formed on a portion of the substrate in the connection region, and a connection wire connecting the soldering pad and the metal grid.

3. The image sensor according to claim 2, further including:
   a passivation layer formed on the connection wire, wherein the passivation layer exposes the soldering pad.

4. The image sensor according to claim 2, further including:
   a device layer formed on the second surface of the substrate, wherein the device layer in the connection region includes a metal layer and a connection plug connected to the metal layer;
   a dielectric structure formed on the first surface of the substrate in the shading region and the connection region;
   a first opening formed in the dielectric structure of the shading region, wherein a portion of the metal grid is exposed on a bottom of the first opening;
   a second opening formed in the dielectric structure of the connection region and the substrate of the connection region, wherein the second opening is formed through the dielectric structure and the substrate to expose the device layer; and
   a third opening formed in the device layer on a bottom of the second opening, wherein a portion of the metal layer in the connection region is exposed at a bottom of the third opening, wherein,
   the soldering pad is formed on the device layer on the bottom of the second opening; and
   the connection wire connected to the soldering pad is formed on the dielectric structure and bottom and sidewall surfaces of the first opening, the second opening, and the third opening.

5. The image sensor according to claim 4, wherein:
   the dielectric structure is made of a material including one of silicon oxide and silicon oxynitride.

6. The image sensor according to claim 4, wherein:
   an acute angle formed between a sidewall of the second opening and a normal direction of the first surface of the substrate is smaller than 50 degrees; and
   a bottom width of the second opening is larger than 50 μm.

7. The image sensor according to claim 4, further including:
   a dielectric structure formed on the substrate in the shading region and the connection region, wherein:

the dielectric structure exposes a portion of a top surface of the metal grid;

the soldering pad is formed on a portion of the dielectric structure in the connection region; and the connection wire is formed on the metal grid and the dielectric structure.

8. The image sensor according to claim 1, wherein:

a photo-sensitive component is formed in a portion of the substrate in the photo-sensitive region;

the substrate includes a carrier collector; and when the carrier collector is configured to capture holes generated by the photo-sensitive component, the operation voltage is greater than or equal to zero volt.

9. The image sensor according to claim 8, further including an anti-reflective layer formed between the substrate in the photo-sensitive region and the buffer layer, wherein:

the anti-reflective layer carries positive charges.

10. An image sensor, comprising:

a substrate having a first surface and a second surface opposite to the first surface, wherein the substrate includes a photo-sensitive region and a connection region;

a buffer layer formed on the first surface of the substrate in the photo-sensitive region;

a metal grid formed on the buffer layer and including a plurality of staggered metal wires, wherein the metal grid is connected to an operation voltage, and a plurality of trenches are formed in the metal grid with each trench surrounded by the plurality of staggered metal wires; and a plurality of color filters formed in the plurality of trenches of the metal grid, wherein:

a photo-sensitive component is formed in a portion of the substrate in the photo-sensitive region;

the substrate includes a carrier collector; and when the carrier collector is configured to capture electrons generated by the photo-sensitive component, the operation voltage is less than or equal to zero volt.

11. The image sensor according to claim 10, further including an anti-reflective layer formed between the substrate in the photo-sensitive region and the buffer layer, wherein:

the anti-reflective layer carries negative charges.

12. The image sensor according to claim 10, further including:

a connection structure formed on the substrate, wherein the connection structure includes a soldering pad formed on a portion of the substrate in the connection region, and a connection wire connecting the soldering pad and the metal grid.

13. A method for fabricating an image sensor, comprising:

providing a substrate having a first surface and a second surface opposite to the first surface, wherein the substrate includes a photo-sensitive region and a connection region, the photo-sensitive region comprises a transparent region and a shading region, and the shading region is between the transparent region and the connection region;

forming a buffer layer on the first surface of the substrate in the photo-sensitive region;

forming a metal grid on the buffer layer and including a plurality of staggered metal wires in the transparent region and in the shading region, wherein the metal grid is connected to an operation voltage, and a plurality of trenches are formed in the metal grid with each trench surrounded by the plurality of staggered metal wires; and forming a plurality of color filters in the plurality of trenches of the metal grid.

14. The method for fabricating the image sensor according to claim 13, wherein a device layer formed on the second surface of the substrate, and a metal layer and a connection plug connected to the metal layer formed in the device layer of the connection region, and prior to forming the color filters, the fabrication methods also includes:

forming a dielectric layer on the first surface of the substrate;

forming a first opening in the dielectric layer of the shading region, wherein a portion of the metal grid is exposed on a bottom of the first opening;

forming a second opening in the dielectric layer of the connection region and the substrate of the connection region, wherein the second opening is formed through the dielectric layer and the substrate to expose the device layer;

forming a third opening in the device layer on a bottom of the second opening, wherein a portion of the metal layer in the connection region is exposed on a bottom of the third opening;

forming a soldering pad on the device layer on the bottom of the second opening;

forming a connection wire on the dielectric layer and bottom and sidewall surfaces of the first opening, the second opening, and the third opening to connect the soldering pad, wherein the connection wire and the soldering pad together form a connection structure; and removing a portion of the dielectric layer formed in the transparent region, wherein a remaining portion of the dielectric layer formed on the first surface of the substrate in the shading region and the connection region becomes a dielectric structure.

15. The method for fabricating the image sensor according to claim 14, after forming the connection structure and prior to removing the portion of the dielectric layer formed in the transparent region, further including:

forming a passivation layer on the connection wire, wherein the passivation layer exposes the soldering pad.

16. The method for fabricating the image sensor according to claim 14, wherein forming the second opening includes:

forming a patterned photoresist layer on the dielectric layer to expose a portion of the dielectric layer in the connection region, wherein a sidewall surface of the patterned photoresist layer and a normal direction of the first surface of the substrate form a first acute angle;

forming the second opening in the connection region through the dielectric layer and the substrate by etching the dielectric layer and the substrate using the patterned photoresist layer as an etch mask, wherein a sidewall surface of the second opening and the normal direction of the first surface of the substrate form a second acute angle.

17. The method for fabricating the image sensor according to claim 16, wherein forming the photoresist layer includes:

forming a patterned initial photoresist layer on the dielectric layer; and performing a thermal treatment process on the patterned initial photoresist layer to allow back flow of the initial photoresist layer.

18. The method for fabricating the image sensor according to claim 17, wherein process parameters used in the thermal treatment process include:

a process temperature in a range of approximately 150° C. to 240° C.; and a process time in a range of approximately 60 seconds to 300 seconds.

19. The method for fabricating the image sensor according to claim 14, prior to forming the dielectric layer, further including:

forming a stop layer on the metal grid and the substrate in the photo-sensitive region, wherein the stop layer is and the dielectric layer are made of different materials.

20. The method for fabricating the image sensor according to claim 19, wherein:

the stop layer is made of one of aluminum oxide, hafnium oxide, silicon nitride, tantalum oxide, and titanium nitride.

* * * * *